(12) United States Patent
He et al.

(10) Patent No.: US 9,082,510 B2
(45) Date of Patent: Jul. 14, 2015

(54) NON-VOLATILE MEMORY (NVM) WITH ADAPTIVE WRITE OPERATIONS

(75) Inventors: Chen He, Austin, TX (US); Richard K. Eguchi, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 356 days.

(21) Appl. No.: 13/616,169

(22) Filed: Sep. 14, 2012

(65) Prior Publication Data

US 2014/0078829 A1  Mar. 20, 2014

(51) Int. Cl.
*G11C 16/10* (2006.01)
*G11C 11/56* (2006.01)

(52) U.S. Cl.
CPC .............. *G11C 11/5628* (2013.01); *G11C 16/10* (2013.01)

(58) Field of Classification Search
CPC ............................ G11C 11/5628; G11C 16/10
USPC ............................ 365/185.29, 185.22, 185.19
See application file for complete search history.

(56) References Cited

U.S. PATENT DOCUMENTS

| | | | |
|---|---|---|---|
| 5,991,201 A | 11/1999 | Kuo et al. | |
| 5,995,416 A * | 11/1999 | Naura et al. | 365/185.18 |
| 6,392,931 B1 * | 5/2002 | Pasotti et al. | 365/185.19 |
| 7,023,737 B1 * | 4/2006 | Wan et al. | 365/185.22 |
| 7,079,424 B1 | 7/2006 | Lee et al. | |
| 7,173,859 B2 | 2/2007 | Hemink | |
| 7,177,199 B2 | 2/2007 | Chen et al. | |
| 7,324,383 B2 * | 1/2008 | Incarnati et al. | 365/185.22 |
| 7,420,856 B2 * | 9/2008 | Chae et al. | 365/189.09 |
| 7,656,710 B1 * | 2/2010 | Wong | 365/185.19 |
| 8,310,870 B2 * | 11/2012 | Dutta et al. | 365/185.03 |
| 2002/0191444 A1 * | 12/2002 | Gregori et al. | 365/185.19 |
| 2008/0239806 A1 * | 10/2008 | Moschiano et al. | 365/185.03 |
| 2009/0323429 A1 * | 12/2009 | Lee et al. | 365/185.19 |
| 2012/0201082 A1 | 8/2012 | Choy et al. | |
| 2013/0182505 A1 * | 7/2013 | Liu et al. | 365/185.17 |

OTHER PUBLICATIONS

U.S. Appl. No. 13/169,989, Eguchi, R.K., et al., "Adaptive Write Procedures for Non-Volatile Memory Using Verify Read", filed Jun. 27, 2011.

* cited by examiner

*Primary Examiner* — Douglas King (57) ABSTRACT

A method of performing a write operation on memory cells of a memory array includes applying a first plurality of pulses the write operation on the memory cells in accordance with a first predetermined ramp rate, wherein the first plurality of pulses is a predetermined number of pulses; performing a comparison of a threshold voltage of a subset of the memory cells with an interim verify voltage; and if a threshold voltage of any of the subset of memory cells fails the comparison with the interim verify voltage, continuing the write operation by applying a second plurality of pulses on the memory cells in accordance with a second predetermined ramp rate which has an increased ramp rate as compared to the first predetermined ramp rate.

12 Claims, 7 Drawing Sheets

NON-VOLATILE MEMORY (NVM) WITH ADAPTIVE WRITE OPERATIONS

BACKGROUND

1. Field of the Disclosure

This disclosure relates generally to non-volatile memories (NVMs), and more specifically, to NVMs that include adaptive write operations.

2. Description of the Related Art

Typical non-volatile memories (NVMs) tend to become more difficult to perform write operations such as program and erase due to charge trapping as the number of program/erase cycles increases. The slow down in writing may become significant and results in reduced performance of the system of which it is a part. This can be significant in any portion of the write process including soft programming where over erase places some bit cells in a high leakage condition. Soft programming then is used to slightly increase the threshold voltage to remove those NVM cells from their high leakage condition. Even though the tunneling portion of the write is normal for erase, it can be used for programming also. In any event, the write speed, whether regular programming, erasing, or soft programming, can be negatively impacted by the charge trapping. Each write operation, including each of the regular program, erase and soft program operations, typically ramps up the magnitude of the relevant high voltage pulses at a rate that is a tradeoff between write performance and the reliability of the bit cells. The current write operations are struggling to maintain the rate of scaling that is occurring for other aspects of semiconductor technology. As the technology and feature size of the memory cells become smaller and operating temperatures increase, write times are a challenge which must be managed.

Thus there is a need for write operations that improve upon one or more the issues raised above.

BRIEF DESCRIPTION OF THE DRAWINGS

The benefits, features, and advantages of the present disclosure will become better understood with regard to the following description, and accompanying drawings where.

DETAILED DESCRIPTION

In one aspect a non-volatile memory has a write operation in which a ramp rate of a write pulse is increased if needed to overcome difficulties in performing the write that arise during program/erase cycles such as issues with charge trapping. After initially using write pulses according to an initial ramp rate, the memory cells are tested to see if they are moving at too slow of a rate. If not, the memory cells continue to be written until successfully written according to a normal ramp rate for the write pulse. If on the other hand the memory cells are moving too slowly, then the writing continues but using the write pulse that is ramped at an increased rate compared to the normal ramp rate. This continues until the NVM cells are successfully written or the write takes too long and is terminated. This has the effect of reducing the damage due to writing compared to the case where the normal ramp rate is unnecessarily high while the count of program/erase cycles has not yet become large. Instead, in anticipation of the write operation becoming too lengthy due to cell degradation or charge trapping as result of the count of program/erase cycles becoming large, the writing pulse is ramped more rapidly in order to meet the write time specification. This not only increases the overall count of program/erase cycles before reaching the point of a failure to write by reducing the damage with a slower normal ramp rate during the time before the program/erase cycle count becomes large, but also improves the write performance after the program/erase cycle count becomes large by switching to an increased ramp rate automatically and adaptively based on monitoring the bit cell movement speed in the write operation.

Figure 1:
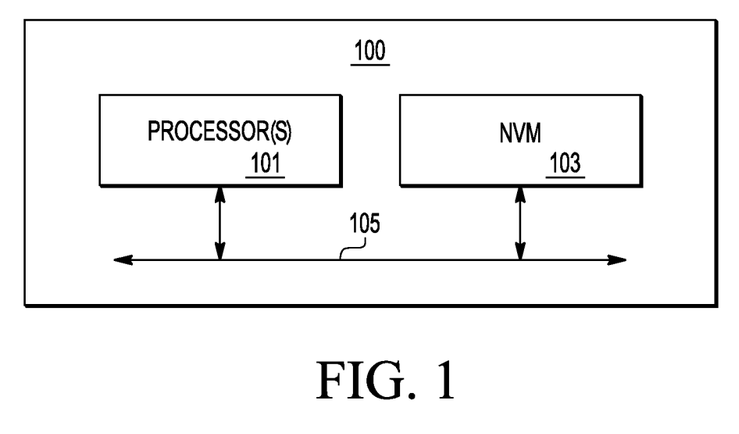
FIG. 1 is a block diagram of an integrated circuit including a non-volatile memory (NVM) according to one embodiment.

FIG. 1 is a block diagram of an integrated circuit 100 including a non-volatile memory (NVM) 103 according to one embodiment. In the illustrated embodiment, the integrated circuit (IC) 100 may implement a system on a chip (SOC) or the like which includes at least one processor 101 coupled to the NVM 103 via an appropriate interface 105, such as a bus or the like with multiple signals or bits. The IC 100 may include other circuits, modules or devices, such as other memory devices (not shown), other functionally modules (not shown), and external interfaces, such as input, output or input/output (I/O) ports or pins or the like (not shown). In one alternative embodiment, the NVM 103 is integrated on the IC 100 alone without any other devices. In another alternative embodiment, the processor 101, NVM 103 and interface 105 are part of a larger system on the IC 100.

Figure 2:
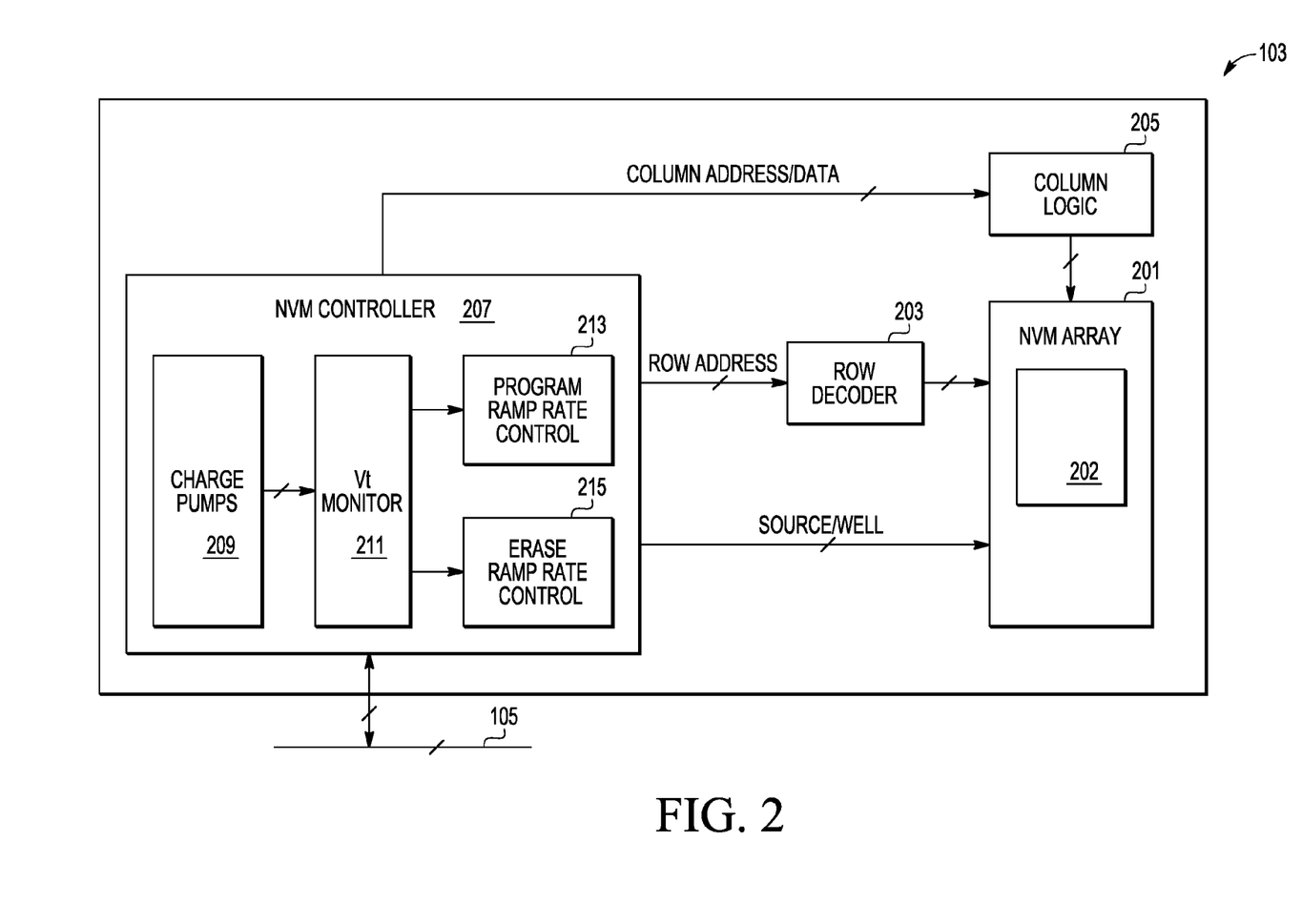
FIG. 2 is a more detailed block diagram of the NVM of FIG. 1 having an NVM array and an NVM controller.

FIG. 2 is a more detailed block diagram of the NVM 103 according to one embodiment coupled to the interface 105. The NVM 103 includes an NVM array 201, a row decoder 203 coupled to the NVM array 201, column logic 205 coupled to the NVM array 201, and a NVM controller 207 coupled to the interface 105, the NVM array 201, the column logic 205, and the row decoder 203. The column logic 205 incorporates a column decoder and sense amplifiers (not shown) and each interface is shown with multiple signals or bits. The NVM controller 207 controls procedure of the NVM array 201 through the row decoder 203 and the column logic 205, such as in response to the processor(s) 101 as communicated through the interface 105 or other interfaces. The NVM controller 207 accesses memory cells within the NVM array 201 by providing a row address to the row decoder 203 and a column address to the column logic 205. Data is written into or read from the NVM array 201 via the column logic 205. The NVM controller 207 also drives source and well voltages (via corresponding switches and controllers, not shown) to the NVM array 201.

Shown within NVM controller 207 are charge pumps 209, threshold voltage (Vt) monitor 211, program ramp rate control logic 213, and erase ramp rate control logic 215. Charge pumps 209 can include a negative charge pump that provides erase gate voltage, a positive charge pump that provides program gate voltage and erase pwell voltage, and a drain pump that provides program drain voltage. The output data from the column logic 205 at a predefined Vt verify read level is provided to the Vt monitor 211. The Vt monitor 211, program ramp rate control logic 213, and erase ramp rate control logic 215 adaptively adjusts the program ramp rate and the erase ramp rate by monitoring an intermediate Vt verify read after a predetermined number of program/erase pulses.

The NVM array 201 incorporates one or more blocks of memory cells in which each memory block has a selected block size, such as, for example, 16 kilobytes (kB), 32 kB, 64 kB, 128 kB, 256 kB, etc. Memory cells in NVM array 201 typically have a gate (G) terminal, a drain (D) terminal and a source (S) terminal along with isolated wells including a pwell (PW) and an nwell (NW). In one embodiment, each memory block is organized into rows and columns of the memory cells. The gate terminal of each row of memory cells is coupled to a corresponding one of multiple wordlines coupled to the row decoder 203. The drain terminal of each column of memory cells is coupled to a corresponding one of multiple bit lines coupled to the column logic 205. The source terminal and wells (PW and NW) of each memory cell are driven or controlled by the NVM controller 207.

As shown, the NVM array 201 includes at least one memory block 202 that is configured to allow program and erase procedures to be performed with adaptively adjustable or configurable ramp rate.

The memory cells in NVM array 201 can be implemented according to any one of several configurations, such as semiconductor configurations, layered silicon-metal nano crystals, etc. In one embodiment, each memory cell is implemented on a silicon substrate or the like. In one embodiment, the pwell of each memory cell is isolated from a P substrate with the nwell. A pair of n+ type doped regions (not shown) are formed in the pwell forming the drain and source terminals of each memory cell. Each memory cell further includes a stacked gate structure or the like, including an oxide layer (not shown) formed on the pwell, a floating gate (not shown) provided on the oxide layer, a dielectric layer (not shown) provided on the floating gate, and a control gate (not shown) provided on the dielectric layer forming a gate terminal. The pwell is generally coupled to a ground voltage Vss and the nwell is generally coupled to a source voltage Vdd except during FN erase pulses as described herein. The voltage level of Vdd depends upon the particular implementation.

In one embodiment, when an voltage pulse is applied to the memory cell during erase and program procedures as further described herein, the pwell and nwell of the memory cell are coupled or otherwise driven together to collectively receive a ramp pulse voltage. An "erase pulse" is said to be applied to each memory cell of the memory block 202 in which the gate terminal is driven to a selected erase pulse voltage and in which the pwell and nwell collectively receive an erase ramp pulse voltage which successively increases. Thus, each erase pulse applied to the memory cells includes an erase pulse voltage applied to the gate terminal and an erase ramp pulse voltage applied to at least one well connection of the memory cells. A "program pulse" is said to be applied to a group of memory cell of the memory block 202 in which the gate terminal is driven to a ramped program gate voltage and the drain terminal is driven to a selected program drain voltage. Program pulses will be applied to the group of memory cells until the group of memory cells are programmed, and such procedure can repeat for other memory cells in the memory block until the entire memory block is programmed. A soft program pulse is similar to the program pulse but with a lower gate voltage. A write operation can be a program, erase, or soft program operation and a write a pulse may be an erase pulse, soft program pulse, or a program pulse.

The present disclosure is described using an exemplary NVM technology in which the erase ramp pulse voltage is applied to the pwells and nwells of the memory cells while the gate terminals receive an erase pulse voltage having a relatively fixed magnitude. In alternative embodiments, such as those using other NVM technologies and the like, the erase ramp pulse voltage is instead applied to a different connection or terminal of the memory cells being erased, such as the gate terminal or the like.

The present disclosure also is described using an exemplary NVM technology in which the ramped program pulse voltage is applied to the gate of the memory cells while the drain terminals receive a different program pulse voltage having a relatively fixed magnitude. In alternative embodiments, such as those using other NVM technologies and the like, the program voltages are instead applied to a different connection or terminal of the memory cell being programmed. This can apply to the soft programming but with the pulse applied to the gate a lower level.

Figure 3:
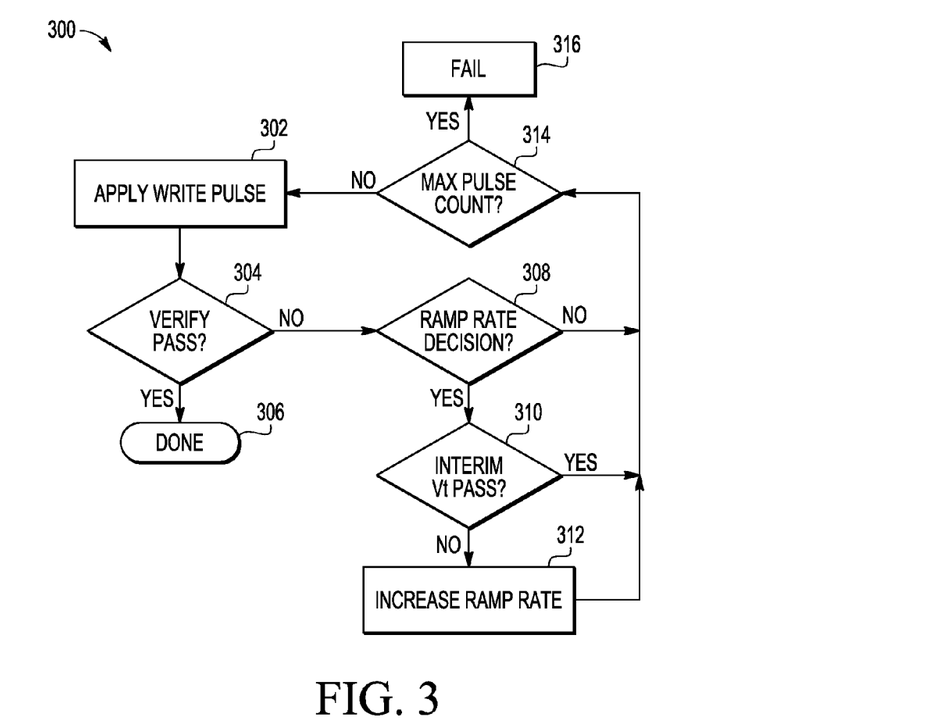
FIG. 3 is a flowchart diagram of a write operation on the NVM array of FIG. 2 generally controlled by the NVM controller of FIG. 2.
Figure 4:
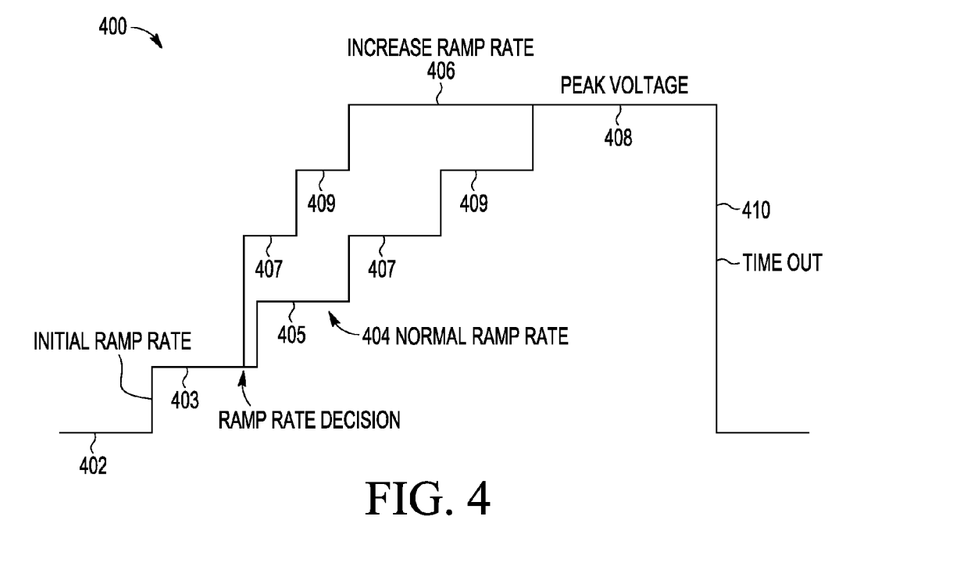
FIG. 4 is a voltage graph useful in understanding the flowchart of FIG. 3.

FIG. 3 is a flowchart diagram of a method 300, which is a method of performing a write operation, generally controlled by the NVM controller 207 of FIG. 2 for the memory block 202 within the NVM array 201 of FIG. 2 and includes steps 302, 304, 306, 308, 310, 312, 314, and 316. Some details relating to method 300 are shown in FIGS. 4, 5, 6, and 7. In step 302 a write pulse is applied to memory block 202 to begin the write operation. A determination at step 304 is made as to whether the memory cells receiving the write pulse have achieved a threshold voltage according to a verify voltage. If all of these memory cells have achieved this threshold voltage, then the write operation is complete as indicated in step 306. If one or more of these memory cells have not achieved the threshold voltage according to the verify voltage, then at step 308 there is a determination as to whether there have been a predetermined number of write pulses applied in order to determine whether a ramp rate change is needed. If the answer is no, then a determination is made at step 314 as to whether the maximum number of pulses have been applied. If the maximum has been applied, then the write operation has failed as indicated in step 316. If the maximum has not been applied, another write pulse is applied as shown for step 302. The process continues this way until either the NVM cells being written all pass as determined in step 304 or the ramp rate decision in step 308 is "yes" meaning that the ramp rate decision is reached. As an example, the ramp rate decision point can be at a predetermined number of pulses from the start. Until this "yes" point, the write pulse has been following an initial ramp rate as shown in FIG. 4. In the example of FIG. 4, there have been a number of write pulses at a first level 403, and then another number at a second level 405.

Figure 5:
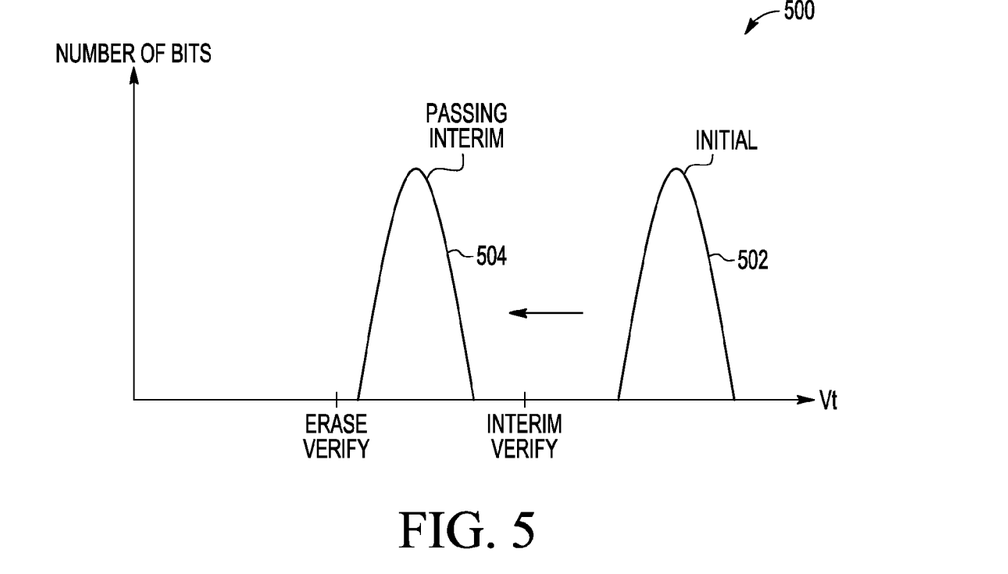
FIG. 5 is a first distribution graph useful in understanding the flowchart of FIG. 3.
Figure 6:
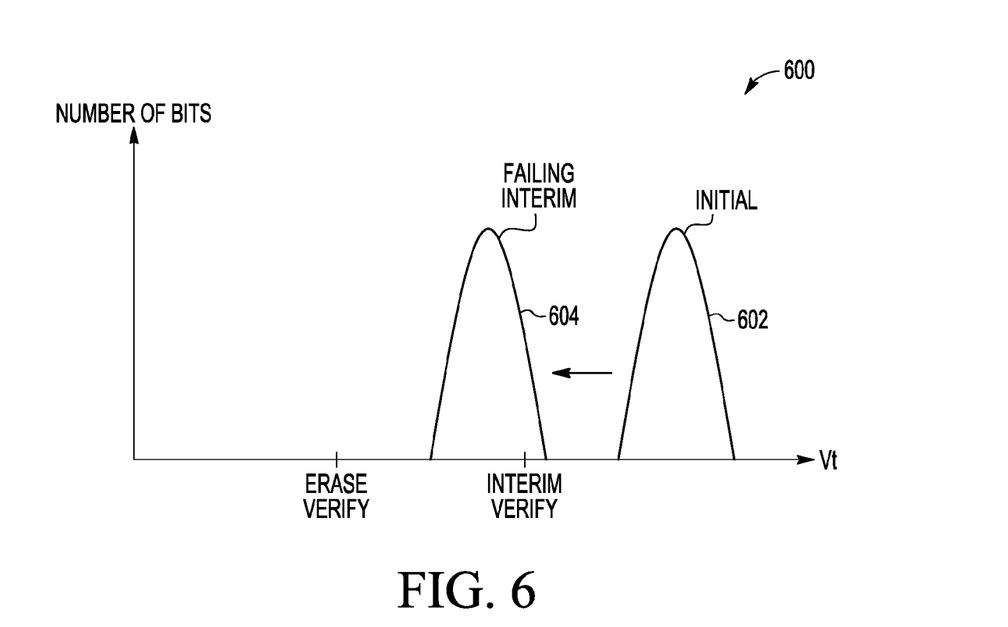
FIG. 6 is a second distribution graph useful in understanding the flowchart of FIG. 3

If it is time for the ramp rated change decision, then a decision is made at step 310 as to whether all of the NVM cells being written have successfully been written to an interim level. FIGS. 5 and 6 show two possibilities for the example of the write operation being an erase operation. Shown in FIG. 5 is a distribution 502 as the initial distribution of NVM cells being written and an interim distribution at the time of the decision relative to a ramp rate change. In order to be successfully written, erased in this cases, all of the NVM cells being written must have been verified to have a sufficiently low threshold voltage as determined by the erase verify of step 304. In FIG. 5, none of the NVM memory cells he have been sufficiently written. In addition there is a further test as indicated in step 310 as to whether a less requirement has been met. This lesser requirement is for determining if the NVM cells being written are behaving as if they had had performance degradation after a relatively large number of program/erase cycles. In this case, all of NVM cells being written do not have this behavior because the entire distribution has had their threshold voltages sufficiently changed that they are to the left of the interim verify point as shown in the graph of FIG. 5. Thus, if the situation is as shown in FIG. 5 when the ramp rate decision point of step 308 has been reached, then the decision at step 310 is that the interim threshold voltage requirement has been met and the test is considered a pass. The write process then continues with a normal ramp rate 404 as shown in FIG. 4 for the write pulse. In this example of normal ramp rate 404, the next levels are levels 405, 407, 409, and finally a peak voltage of 408. Each transition to the next level for normal ramp rate 404 as combined with initial ramp rate 402 is separated by the same number of write pulses. That is, the normal ramp rate is the same as the initial ramp rate. The number of pulses possible before timing out at peak voltage 408 appears to be about twice the number of pulses at any of the other levels but this is not to scale and the difference is likely to be much greater than that. The actually number is determined experimentally based on the particular characteristics of the degradation with the number of program/erase cycles.

Figure 7:
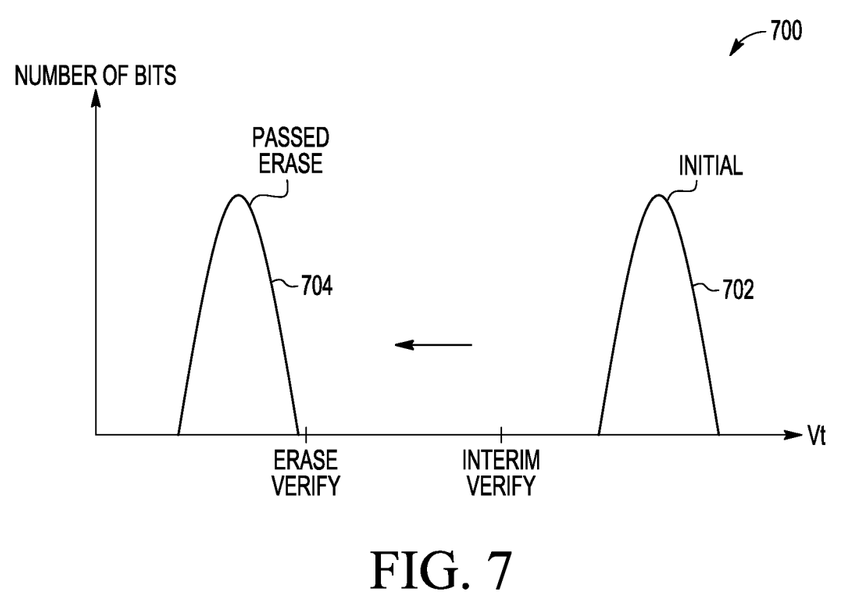
FIG. 7 is a third distribution graph useful in understanding the flowchart of FIG. 3.

On the other hand, the possibility shown in FIG. 6 is that some of the NVM cells have not changed threshold voltage sufficiently to move to the left of the interim verify. This indicates that there has been performance degradation due to a large number of program/erase cycles and that an increased ramp rate for the write operation is desirable in order to successfully complete the write operation. Thus, at step 310 the decision is that interim Vt requirement is not passed and that at step 312 an increased ramp rate for the write pulse is invoked. This is shown in FIG. 4 as increased ramp rate 406 which shows that the next write pulse is at level 407. If needed, the write pulse is further increased and each increase to the next level is at the rate of about half the number of pulses for normal ramp rate 404. Thus, when it is detected that the NVM cells have experienced performance degradation due to many program/erase cycles, the write pulse is ramped at an increased rate. One consequence is that the peak voltage 408 is reached sooner and a higher percentage of the write cycle will be at a higher voltage for these NVM cells that invoke the increased ramp rate for the write pulse. At such time as time out 410 is ultimately reached, then the write operation has failed. Prior to that, the ultimate result will be that shown in FIG. 7 in which all of the NVM cells being written will have passed the write operation, which in the example of FIGS. 5-7 is an erase operation. The erase operation will often result in some of the NVM cells being over erased and require soft programming for those over erased cells.

Figure 8:
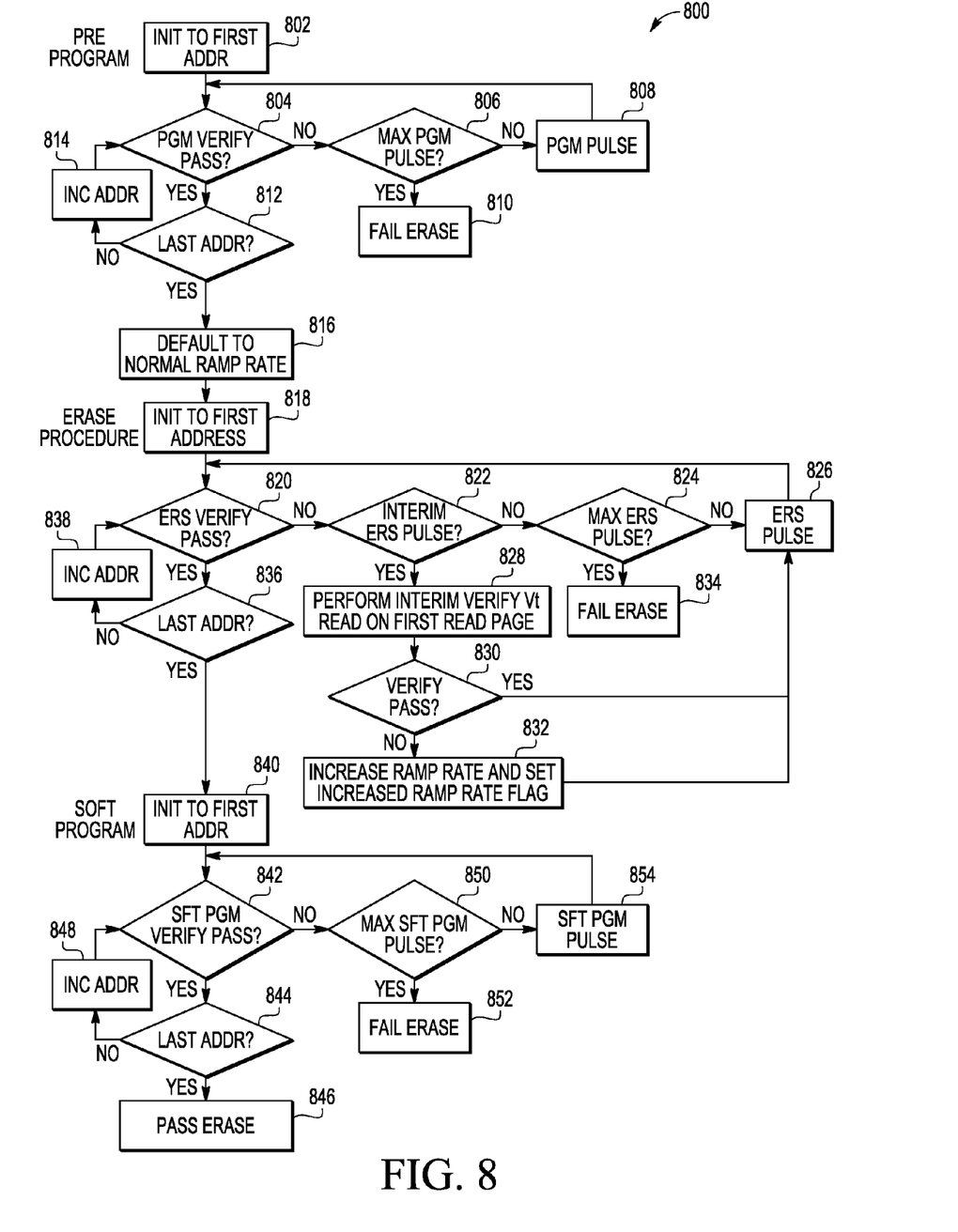
FIG. 8 is a more detailed flowchart showing a write operation that is an erase operation.

Shown in FIG. 8 is a method 800 that shows when the write operation is an erase operation and provides more detail than method 300. The erase operation can include a pre-program procedure that includes steps 802-814, an erase procedure that includes steps 816-838, and a soft program procedure that includes steps 840-854.

During the pre-programming procedure, step 802 can include initializing a current row and column address to a first address in memory block 202. At step 804, a program (PGM) verify test is performed for the current address in the memory block 202. Although programming and verification may be performed on individual memory cells or subsets of memory cells, programming and verification is typically performed on a per-page basis in which each page includes a selected number of memory cells or bits, such as 128 bits or the like. A programming pulse may be applied to multiple memory cells or bits at a time, such as up to 18 bits. During the preprogram verify test, the Vt of each memory cell at the current address is compared with a program verify threshold (PVT) voltage. If the Vt of any memory cell at the current address is below the PVT voltage, operation proceeds to step 806 to determine whether the maximum number of program pulses have been applied. If the maximum number of program pulses have not been applied, operation proceeds to step 808 to apply the next program pulse to the memory cells below PVT, and then to step 804.

If step 806 determines that the maximum number of program pulses have been applied, step 810 indicates that the erase operation has failed.

Returning to step 804, if the program verify procedure passed at the current address (i.e., Vt of all memory cells at the address are at or above the PVT voltage, for example, 6V), step 812 determines whether the last address has been programmed. If the last address has not been programmed, step 814 increments the current address and returns operation to step 804. Otherwise, if the last address has been programmed, operation continues to step 816. Operation loops between steps 804 and 808 by applying additional program pulses until the Vt of each memory cell of the memory block 202 is at least PVT.

After the pre-program procedure is completed, operation advances to step 816 of the erase procedure. Step 816 can include defaulting the erase procedure to be performed using a normal ramp rate on the memory block 202. Step 818 can include initializing the address to the first address in the memory block 202. In any event, this uses the normal ramp rate for the erase pulse for the initial part of the erase operation. This is analogous to initial ramp rate 402 shown in FIG. 4.

Step 820 can perform an erase (ERS) verify test for the memory cells of the memory block 202 to determine whether the memory block 202 meets an erase metric. While erase pulse is typically a bulk operation that will be applied to the entire memory block 202 or a subset of memory block 202, erase verify is typically performed on a per-page basis in which each page includes a selected number of memory cells or bits, such as 128 bits or the like. During the erase verify test, the Vt of each of the memory cells can be compared with an erase verify threshold (EVT) voltage (representing the erase metric for each of the memory cells). If the Vt of any memory cell of the memory block 202 is above the EVT voltage, for example 3.5V, the operation proceeds to step 822, which determines whether the current erase pulse is a selected interim pulse. This is analogous to step 308 of method 300 shown in FIG. 3. The interim pulse number is predetermined for a specific NVM technology. For example, in one NVM technology, the pwell voltage during erase procedure will ramp from 4.2 v to 8.5 v. Accordingly, the selected interim pulse can be one at which the voltage is above a predetermined level for efficient erase procedures, but less than the maximum erase voltage to be applied.

If the current erase pulse is not the selected interim pulse, step 824 determines whether the maximum number of erase pulses has been applied. If the maximum number of erase pulses has not been applied, step 826 applies the next erase pulse and control returns to step 820.

Referring back to step 822, if the current erase pulse is the selected interim pulse, step 828 performs an interim erase verify read of Vt on the first read page by the Vt monitor 211. This is analogous to step 310 of method 300 shown in FIG. 3. If step 830 determines that all bits in the first read page have a Vt voltage that is lower than a specified voltage, the verify read has passed and control is transferred to step 826 to apply the next erase pulse. The ramp rate continues at the normal ramp rate analogous to normal ramp rate 404 shown in FIG. 4. If step 830 determines that the verify read did not pass, for example, not all bits in first read page are below the predetermined interim verify read Vt level, step 832, enables an increase in the ramp rate of the erase pulse. Also it may be beneficial to set the increased ramp rate flag as an indicator to users that the increased ramp rate is being used for erase. This is analogous to step 312 of method 300 shown in FIG. 3 and increased ramp rate 406 shown in FIG. 4. The erase procedure then transfers from step 832 to step 826 at the increased ramp rate.

Referring back to step 820, if the erase verify passed on the selected read page or address, for example, Vt of any memory cell of the selected read page in the memory block 202 is not above the EVT voltage, operation proceeds to step 836 to determine whether the last address has been erase verified. If the last address has not been erase verified, step 838 increments the address and transfers procedure to step 820. Procedure loops through steps 820 to 832 by applying additional erase pulses until the Vt of each memory cell of the memory block 202 is below EVT. If step 824 determines that the maximum number of erase pulses have been applied, process 834 indicates that the erase operation has failed.

The embodiment of method 800 shown in FIG. 8 is set up to adaptively adjust the erase ramp rate between two different ramp rates. Erase procedure 800 can be configured to handle more than two ramp rates to further manage the bit cell performance degradation by checking a greater number of interim erase pulses and interim verify read levels.

After the erase procedure is completed, the soft program procedure is initiated for the memory block 202 to place the Vt of the over-erased memory cells within the desired voltage range between the soft program verify voltage threshold (SPVT) and EVT. The soft program procedure is typically performed on a per-page basis in which each page includes a selected number of memory cells, such as 128 cells or the like. A soft program pulse may be applied to multiple memory cells at a time. In one embodiment, soft program pulses may be applied up to 36 memory cells at a time. The soft program pulse is typically not as strong as a program pulse, such as having a lower voltage, a shorter pulse duration, or a combination of both. The soft program procedure starts with step 840 which can include initializing the address to the first address in the memory block 202. Operation proceeds to step 842 to perform a soft program (SFT PGM) verify test, in which the Vt of each memory cell at the current address is compared with the SPVT voltage. If Vt of any memory cell at current address is below the SPVT voltage, operation proceeds to step 850 to determine whether the maximum number of soft program pulses have been applied. If the maximum number of soft program pulses has not been applied, operation proceeds to step 854 to apply a soft program pulse to memory cells which fail the soft program verify read at the current address. The soft program pulse has a selected voltage level and duration to increase Vt above SPVT while remaining below EVT. Procedure returns to step 842 to determine whether the Vt of each memory cell at current address is below SPVT, and procedure loops between steps 842 and 854 by applying additional soft program pulses until Vt of each memory cell of the memory block 202 is between the SPVT and EVT voltages.

If step 850 determines that the maximum number of soft program pulses have been applied, step 852 indicates that the erase operation has failed.

Referring to step 842, if the soft program verify procedure passed (i.e., Vt is greater than or equal to SPVT voltage), step 844 determines whether the last address has been soft program verified. If the last address has not been soft program verified, step 848 increments the address and returns procedure to step 842. Otherwise, if the last address has been soft program verified, procedure passes to step 846 to indicate that the erase operation has passed. As an alternative, soft programming can also include a ramp rate change for a programming pulse as for a programming method to shown in FIG. 9

Figure 9:
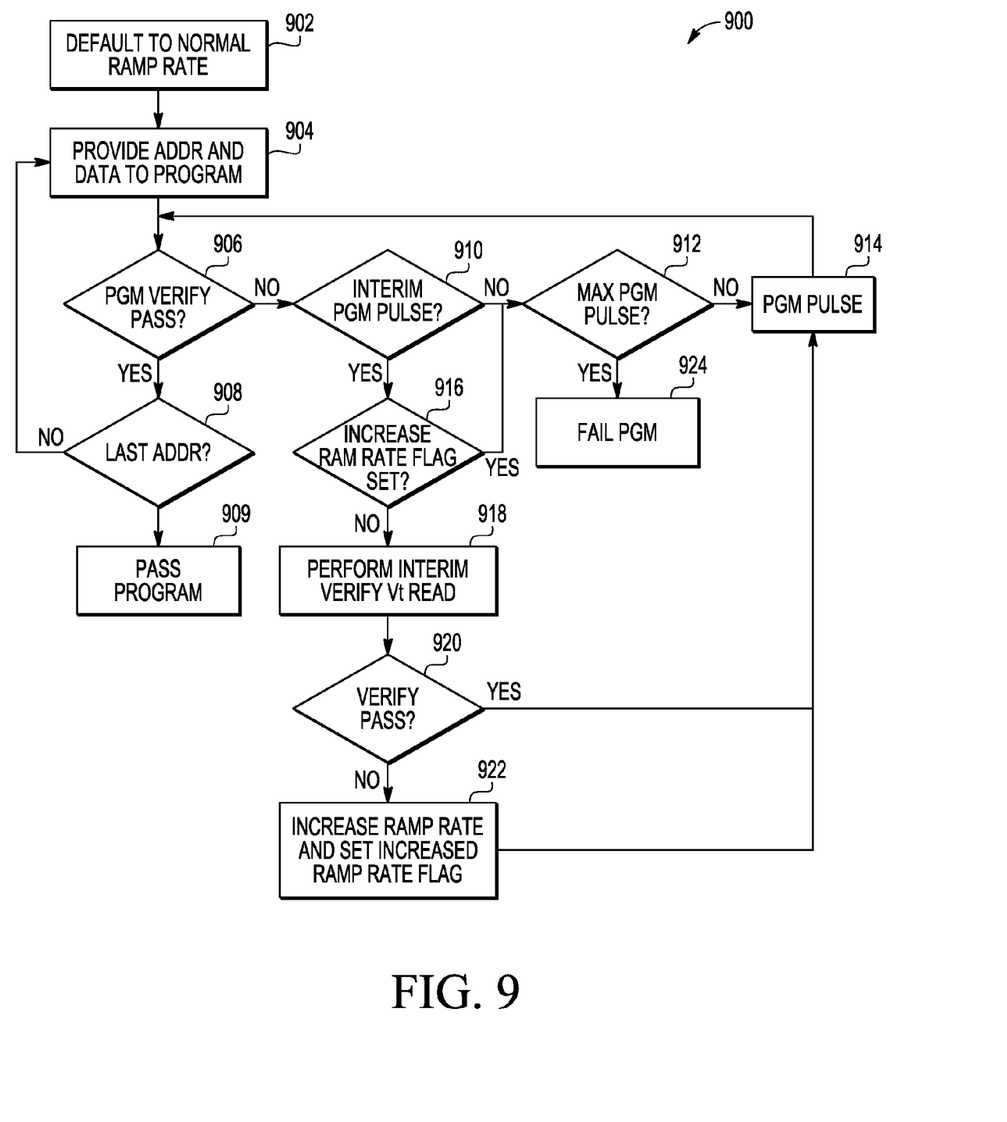
FIG. 9 is a more detailed flowchart showing a write operation that is a program operation.

FIG. 9 is a flowchart diagram of an embodiment of a method 900 for programming, and similarly for soft programming, at least a portion of the memory block 202 generally executed and controlled by the NVM controller 207 of FIG. 2. In any event, the step begins with an erase pulse that is ramped initially at a normal ramp rate analogous to ramp rate 402 shown in FIG. 4. Step 904 can include providing the first memory cell address and the data to be written in the memory block 202 to NVM controller 207.

Step 906 can perform a program verify test for the current memory cell of the memory block 202 to determine whether the memory cell meets a program metric. During the program verify test, the Vt of each memory cell at the current address can be compared with a program verify threshold (PVT) voltage (representing the program metric). If the Vt of any of the memory cell at current address is below the PVT voltage, operation proceeds to step 910, which determines whether the current program pulse is a selected interim program pulse. The selected interim program pulse is a pulse that is less than the maximum number of pulses to be applied during the program procedure, but at or above the pulse number where a memory cell would typically meet the PVT during normal operation, for example, without extensive leakage. This is analogous to step 308 of method 300 shown in FIG. 3.

If the current program pulse is not the selected interim program pulse, step 912 determines whether the maximum number of program pulses has been applied. If the maximum number of program pulses has not been applied, step 914 applies the next program pulse and transfers to step 906.

Referring back to step 910, if the current program pulse is the selected interim program pulse, step 916 determines whether an increased ramp rate flag has been set to indicate that the increased ramp rate has already been enabled due to degraded performance being detected while a previous memory address was being programmed. If the increased ramp rate flag has been set, step 916 transfers control to step 912. If the increased ramp rate flag has not been set, step 916 transfers control to step 918.

Step 918 can include performing an interim program verify read of Vt by the Vt monitor 211. If step 920 determines that the interim program verify Vt read has passed in that all bits in the page being programmed have a Vt voltage that is higher than a specified voltage, control is transferred to step 914 to apply the next program pulse and the programming continues using the normal ramp rate which is analogous to normal ramp rate 404 shown in FIG. 4. If step 920 determines that the verify Vt read did not pass, step 922 enables the increased ramp rate and sets the increased ramp rate flag and the ramp rate of the program pulse is increased analogous to increased ramp rate 406 shown in FIG. 4.

Referring back to step 906, if the program verify passed, operation proceeds to step 908 to determine whether the last address has been programmed. If the last address has been programmed, step 909 indicates that the programming operation for the group of memory cells has passed. If the last address has not been programmed, step 908 transfers operation to step 904. Operation loops through steps 904 to 914 by applying additional program pulses until the Vt of each memory cell of the memory block 202 is at least PVT.

The embodiment of method 900 shown in FIG. 9 is set up to adaptively adjust the program ramp rate between two different ramp rates. Program procedure 900 can be configured to handle more than two ramp rates by checking a greater number of interim program pulses, and using additional increased ramp rate flags. Method 900 can be easily adapted for use in soft programming. For soft programming, there would be a particular point at which it would be determined if there should be a ramp rate change. This point would be chosen for soft programming and would be detected at step 910. There would be a programming status that would indicate if programming progress was indicative of performance degradation due to a large number of previous program/erase cycles. This criteria would be used in step 920. Based on the determination, the ramp rate at step 922 would either continue with the normal ramp rate or change to the increased ramp rate.

By now it should be appreciated that systems and methods have been disclosed that adaptively adjust the write pulse ramp rate by monitoring the memory cell Vt movement during program, soft program, and/or erase operation. That is, when the memory cells moved too slow and failed an interim verify Vt check, the ramp rate of the write pulse would be increased to reduce the slow down in write time due to charge trapping. This allows for reducing the damage to the NVM cells by avoiding the peak voltage or at least less time at the peak voltage during a first portion of the life of the NVM and only later is the ramp rate increased in order to meet the specified write time.

In particular a method of performing a write operation on memory cells of a memory array includes applying a first plurality of pulses of the write operation on the memory cells in accordance with a first predetermined ramp rate, wherein the first plurality of pulses is a predetermined number of pulses. The method further includes performing a comparison of a threshold voltage of a subset of the memory cells with an interim verify voltage. The method further includes, if a threshold voltage of any of the subset of the memory cells fails the comparison with the interim verify voltage, continuing the write operation by applying a second plurality of pulses on the memory cells in accordance with a second predetermined ramp rate which has an increased ramp rate as compared to the first predetermined ramp rate. The method may further include, if a threshold voltage of each of the subset of memory cells passes the comparison with the interim verify voltage, continuing the write operation by applying a second plurality of pulses on the memory cells in accordance with the first predetermined ramp rate. The method may have a further characterization by which the performing the write operation comprises performing an erase procedure. The method may have a further characterization by which the applying the first plurality of pulses and the applying the second plurality of pulses is performed on every memory cell of the memory cells. The method may have a further characterization by which, after applying each pulse of the first plurality of pulses and each pulse of the second plurality of pulses, performing a comparison of a threshold voltage of the subset of the memory cells with an erase verify voltage, wherein if the threshold voltage of each of the subset of memory cells passes the comparison with the erase verify voltage, continuing with a soft-program procedure of the write operation on the memory cells. The method may have a further characterization by which the memory cells are arranged in a plurality of pages, wherein each page as a plurality of the memory cells, and wherein the subset of the memory cells is further characterized as a first page of the plurality of pages. The method may have a further characterization by which the first predetermined ramp rate uses a first voltage increment and the second predetermined ramp rate uses a second voltage increment which is greater than the first voltage increment. The method may have a further characterization by which the first predetermined ramp rate uses a first pulse width for the first plurality of pulses and the second predetermined ramp rate uses a second pulse width for the second plurality of pulses that is smaller than the first pulse width. The method may have a further characterization by which performing the write operation comprises performing a program procedure or a soft-program procedure. The method may have a further characterization by which wherein after the applying each pulse of the first plurality of pulses and each pulse of the second plurality of pulses, performing a comparison of a threshold voltage of the subset of the memory cells with a program verify voltage, wherein applying the first plurality of pulses of the write operation on the memory cells is further characterized in that the first plurality of pulses is applied only to those memory cells of the subset of the memory cells whose threshold voltage fails the comparison with the program verify voltage and applying the second plurality of pulses of the write operation on the memory cells is further characterized in that the second plurality of pulses is applied only to those memory cells of the subset of memory cells whose threshold voltage fails the comparison with the program verify voltage. The method may have a further characterization by which the second plurality of pulses is a second predetermined number of pulses and the method may further comprise performing a comparison of a threshold voltage of the subset of the memory cells with a second interim verify voltage, if a threshold voltage of any of the subset of memory cells fails the comparison with the second interim verify voltage, continuing the write operation by applying a third plurality of pulses on the memory cells in accordance with a third predetermined ramp rate which has an increased ramp rate as compared to the second predetermined ramp rate, and if a threshold voltage of each of the subset of memory cells passes the comparison with the second interim verify voltage, continuing the write operation by applying a fourth plurality of pulses on the memory cells in accordance with the first or the second predetermined ramp rate.

Disclosed also is a method of performing a write operation on memory cells of a memory array. The method includes, in an erase procedure of the write operation, applying a predetermined number of pulses to a subset of the memory cells in accordance with a first predetermined ramp rate. The method also includes determining if a threshold voltage of at least one memory cell of the subset of memory cells is greater than an interim verify voltage. The method also includes applying a plurality of additional pulses on each memory cell of the subset of memory cells. The method also includes, if the threshold voltage of at least one memory cell of the subset of memory cells is greater than the interim verify voltage, the plurality of additional pulses is applied in accordance with a second predetermined ramp rate which has an increased ramp rate as compared to the first predetermined ramp rate. The method further includes, if the threshold voltage of each memory cell of the subset of memory cells is not greater than the interim verify voltage, the plurality of additional pulses is applied in accordance with the first predetermined ramp rate. The method may have a further characterization by which, after the erase procedure, the method may further include continuing the write operation by performing a soft-program procedure on the memory cells. The method may have a further characterization by which, in the erase procedure of the write operation, the method may further include, after applying each pulse of the predetermined number of pulses and each pulse of the plurality of additional pulses, comparing a threshold voltage of the subset of the memory cells with an erase verify voltage, wherein if the threshold voltage of every memory cell of the subset of memory cells is less than the erase verify voltage, continuing with a soft-program procedure of the write operation on the memory cells. The method may have a further characterization by which the memory cells are arranged in a plurality of pages, wherein each page as a plurality of the memory cells, and wherein the subset of the memory cells is further characterized as a first page of the plurality of pages. The method may have a further characterization by which the first predetermined ramp rate uses a first voltage increment and the second predetermined ramp rate uses a second voltage increment which is greater than the first voltage increment. The method may have a further characterization by which the first predetermined ramp rate uses a first pulse width and the second predetermined ramp rate uses a second pulse width that is smaller than the first pulse width.

Also disclosed is a non-volatile memory (NVM) system that includes an array of memory cells that are non-volatile. The NVM system further includes a controller coupled to the array, wherein the controller, for a write operation, applies a first plurality of pulses the write operation to the array in accordance with a first predetermined ramp rate, wherein the first plurality of pulses is a predetermined number of pulses, compares a threshold voltage of a subset of the array with an interim verify voltage, and if a threshold voltage of any memory cell of the subset fails the comparison with the interim verify voltage, the controller continues the write operation by applying a second plurality of pulses to the array in accordance with a second predetermined ramp rate which has an increased ramp rate as compared to the first predetermined ramp rate. The NVM system may have a further characterization by which, if a threshold voltage of each memory cell of the subset passes the comparison with the interim verify voltage, the controller continues the write operation by applying a third plurality of pulses on the memory cells in accordance with the first predetermined ramp rate. The NVM system may have a further characterization by which the write operation comprises at least one of a program procedure, a soft-program procedure, and an erase procedure.

Thus, it is to be understood that the architecture depicted herein is merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the spirit and scope of the disclosure as defined by the appended claims.

What is claimed is:

1. A method of performing a write operation on memory cells of a memory array, the method comprising:
   applying a first plurality of pulses of the write operation on the memory cells in accordance with a first predetermined ramp rate, wherein the first plurality of pulses is a predetermined number of pulses;
   performing a comparison of a threshold voltage of a subset of the memory cells with an interim verify voltage;
   if a threshold voltage of any of the subset of the memory cells fails the comparison with the interim verify voltage, continuing the write operation by applying a second plurality of pulses on the memory cells in accordance with a second predetermined ramp rate which has an increased ramp rate as compared to the first predetermined ramp rate; and
   if a threshold voltage of each of the subset of memory cells passes the comparison with the interim verify voltage, continuing the write operation by applying a second plurality of pulses on the memory cells in accordance with the first predetermined ramp rate.

2. The method of claim 1, wherein the performing the write operation comprises performing an erase procedure.

3. The method of claim 2, wherein the applying the first plurality of pulses and the applying the second plurality of pulses is performed on every memory cell of the memory cells.

4. The method of claim 3, wherein, after applying each pulse of the first plurality of pulses and each pulse of the second plurality of pulses, performing a comparison of a threshold voltage of the subset of the memory cells with an erase verify voltage, wherein if the threshold voltage of each of the subset of memory cells passes the comparison with the erase verify voltage, continuing with a soft-program procedure of the write operation on the memory cells.

5. The method of claim 1, wherein the memory cells are arranged in a plurality of pages, wherein each page as a plurality of the memory cells, and wherein the subset of the memory cells is further characterized as a first page of the plurality of pages.

6. The method of claim 1, wherein the first predetermined ramp rate uses a first voltage increment and the second predetermined ramp rate uses a second voltage increment which is greater than the first voltage increment.

7. The method of claim 1, wherein the first predetermined ramp rate uses a first pulse width for the first plurality of pulses and the second predetermined ramp rate uses a second pulse width for the second plurality of pulses that is smaller than the first pulse width.

8. The method of claim 1, wherein performing the write operation comprises performing a program procedure or a soft-program procedure.

9. The method of claim 8, wherein after the applying each pulse of the first plurality of pulses and each pulse of the second plurality of pulses, performing a comparison of a threshold voltage of the subset of the memory cells with a program verify voltage, wherein:
   applying the first plurality of pulses of the write operation on the memory cells is further characterized in that the first plurality of pulses is applied only to those memory cells of the subset of the memory cells whose threshold voltage fails the comparison with the program verify voltage; and
   applying the second plurality of pulses of the write operation on the memory cells is further characterized in that the second plurality of pulses is applied only to those memory cells of the subset of memory cells whose threshold voltage fails the comparison with the program verify voltage.

10. The method of claim 1, wherein the second plurality of pulses is a second predetermined number of pulses, the method further comprising:
   performing a comparison of a threshold voltage of the subset of the memory cells with a second interim verify voltage;
   if a threshold voltage of any of the subset of memory cells fails the comparison with the second interim verify voltage, continuing the write operation by applying a third plurality of pulses on the memory cells in accordance with a third predetermined ramp rate which has an increased ramp rate as compared to the second predetermined ramp rate; and
   if a threshold voltage of each of the subset of memory cells passes the comparison with the second interim verify voltage, continuing the write operation by applying a fourth plurality of pulses on the memory cells in accordance with the first or the second predetermined ramp rate.

11. A non-volatile memory (NVM) system, comprising:
   an array of memory cells that are non-volatile;
   a controller coupled to the array, wherein the controller, for a write operation, applies a first plurality of pulses the write operation to the array in accordance with a first predetermined ramp rate, wherein the first plurality of pulses is a predetermined number of pulses, compares a threshold voltage of a subset of the array with an interim verify voltage, and if a threshold voltage of any memory cell of the subset fails the comparison with the interim verify voltage, the controller continues the write operation by applying a second plurality of pulses to the array in accordance with a second predetermined ramp rate which has an increased ramp rate as compared to the first predetermined ramp rate; and
   wherein if a threshold voltage of each memory cell of the subset passes the comparison with the interim verify voltage, the controller continues the write operation by applying a third plurality of pulses on the memory cells in accordance with the first predetermined ramp rate.

12. The NVM system claim 11, wherein the write operation comprises at least one of a program procedure, a soft-program procedure, and an erase procedure.

* * * * *